(12) United States Patent
Kim (10) Patent No.: US 12,280,566 B2
(45) Date of Patent: Apr. 22, 2025

(54) CERAMIC SUSCEPTOR

(71) Applicant: MiCo Ceramics Ltd., Anseong-si (KR)

(72) Inventor: Taekgon Kim, Anseong-si (KR)

(73) Assignee: MiCo Ceramics Ltd., Anseong-si (KR)

( * ) Notice: Subject to any disclaimer, the term of this patent is extended or adjusted under 35 U.S.C. 154(b) by 0 days.

(21) Appl. No.: 18/498,084

(22) Filed: Oct. 31, 2023

(65) Prior Publication Data

US 2024/0140076 A1   May 2, 2024

(30) Foreign Application Priority Data

Oct. 31, 2022  (KR) .................. 10-2022-0142639

(51) Int. Cl.
  *B32B 18/00*  (2006.01)
  *C23C 16/06*  (2006.01)
  *C23C 16/458* (2006.01)

(52) U.S. Cl.
  CPC .............. *B32B 18/00* (2013.01); *C23C 16/06* (2013.01); *C23C 16/4586* (2013.01)

(58) Field of Classification Search
  None
  See application file for complete search history.

(56) References Cited

U.S. PATENT DOCUMENTS

| | | | |
|---|---|---|---|
| 8,672,455 B2 | 3/2014 | Ohashi et al. | |
| 2007/0097603 A1 | 5/2007 | Fujii | |
| 2009/0277895 A1* | 11/2009 | Komatsu | C23C 16/4586 108/50.02 |
| 2012/0250211 A1* | 10/2012 | Kida | H01L 21/6833 361/234 |
| 2013/0126206 A1 | 5/2013 | Zhou et al. | |
| 2014/0041435 A1 | 2/2014 | Cha | |
| 2016/0002766 A1 | 1/2016 | Cha et al. | |
| 2016/0049323 A1 | 2/2016 | Ye et al. | |

(Continued)

FOREIGN PATENT DOCUMENTS

| | | |
|---|---|---|
| CN | 102208524 A | 10/2011 |
| JP | 2004018907 A | 1/2004 |

(Continued)

OTHER PUBLICATIONS

Kim, Hoe-Geun, et al.; Effect of Various Interlayer Deposition on Room Temperature and High Temperature Properties of CrAlN Coatings. The Korean Institute of Surface Engineering. Proceedings of the Korean Institute of Surface Engineering Conference. 2017. 05a / pp. 143-143 / 2017.

(Continued)

*Primary Examiner* — Jeffrie R Lund
*Assistant Examiner* — Tiffany Z Nuckols
(74) *Attorney, Agent, or Firm* — Novick, Kim & Lee, PLLC; Jae Youn Kim (57) ABSTRACT

Provided is a ceramic susceptor, which includes a ceramic plate with a radio-frequency electrode disposed therein, wherein the ceramic plate includes a connector connected to the radio-frequency electrode, the ceramic susceptor includes a rod having one end connected to the connector to supply power to the radio-frequency electrode, and the rod employs Mo, W, or an alloy thereof as a base material and includes a metal nitride film containing Cr on the surface of the base material.

5 Claims, 8 Drawing Sheets

(56) References Cited

U.S. PATENT DOCUMENTS

| | | | |
|---|---|---|---|
| 2016/0060746 A1* | 3/2016 | Ramm | C23C 14/325 |
| | | | 204/192.15 |
| 2017/0190139 A1* | 7/2017 | Haghdoost | B32B 3/18 |
| 2017/0204514 A1 | 7/2017 | Kim et al. | |
| 2017/0278682 A1 | 9/2017 | Lin et al. | |
| 2018/0174878 A1 | 6/2018 | Kimura et al. | |
| 2019/0226512 A1* | 7/2019 | Raj | B23K 1/206 |
| 2021/0100072 A1* | 4/2021 | Park | H05B 3/265 |
| 2022/0030669 A1 | 1/2022 | Aikawa et al. | |
| 2022/0230905 A1 | 7/2022 | Ishikawa et al. | |

FOREIGN PATENT DOCUMENTS

| | | |
|---|---|---|
| JP | 2006114250 A | 4/2006 |
| JP | 2007123601 A | 5/2007 |
| JP | 2015159232 A | 9/2015 |
| JP | 2017020056 A | 1/2017 |
| JP | 2017022284 A | 1/2017 |
| JP | 2018139255 A | 9/2018 |
| JP | 2021014611 A | 2/2021 |
| JP | 2022111734 A | 8/2022 |
| KR | 20140019673 A | 2/2014 |
| KR | 20140097312 A | 8/2014 |
| KR | 101465640 B1 | 11/2014 |
| KR | 101640912 B1 | 7/2016 |
| KR | 20170042359 A | 4/2017 |
| KR | 10-2018-0121662 A | 11/2018 |
| KR | 102254204 B1 | 5/2021 |
| KR | 102275508 B1 | 7/2021 |
| KR | 10-2021-0139368 A | 11/2021 |
| WO | 2022080522 A1 | 4/2022 |

OTHER PUBLICATIONS

Notice of Allowance JPO for Japanese application No. 2023-186275, issued on Feb. 6, 2024.

* cited by examiner

CERAMIC SUSCEPTOR

CROSS-REFERENCE TO RELATED APPLICATION(S)

This application is based on and claims priority under 35 U.S.C. 119 to Korean Patent Application No. 10-2022-0142639, filed on Oct. 31, 2022, in the Korean Intellectual Property Office, the disclosure of which is herein incorporated by reference in its entirety.

BACKGROUND

Field of the Invention

The present disclosure relates to a ceramic susceptor and, specifically, to a ceramic susceptor wherein a material for a radio-frequency rod (RF rod) for reducing the impedance is applied to a ceramic susceptor based on ceramics, such as AlN.

Semiconductor devices or display devices are typically manufactured by sequentially depositing a plurality of thin film layers including dielectric layers and metal layers on a glass substrate, flexible substrate, or semiconductor wafer substrate, followed by patterning. These thin film layers are sequentially deposited on the substrate by chemical vapor deposition (CVD) or physical vapor deposition (PVD). Examples of CVD are low-pressure CVD (LPCVD), plasma-enhanced CVD (PECVD), metal organic CVD (MOCVD), and the like. In devices for CVD and PVD, a ceramic susceptor is disposed to support a glass substrate, flexible substrate, or semiconductor wafer substrate and generate a radio-frequency signal for producing heat or generating plasma. The ceramic susceptor is widely used according to the accurate temperature control and heat treatment requirement in a plasma deposition process or the like for precise processes, such as finer wiring of semiconductor devices, and is also used for plasma formation or substrate heating in an etching process or photoresist baking process of thin film layers formed on the semiconductor wafer substrate.

Figure 1:
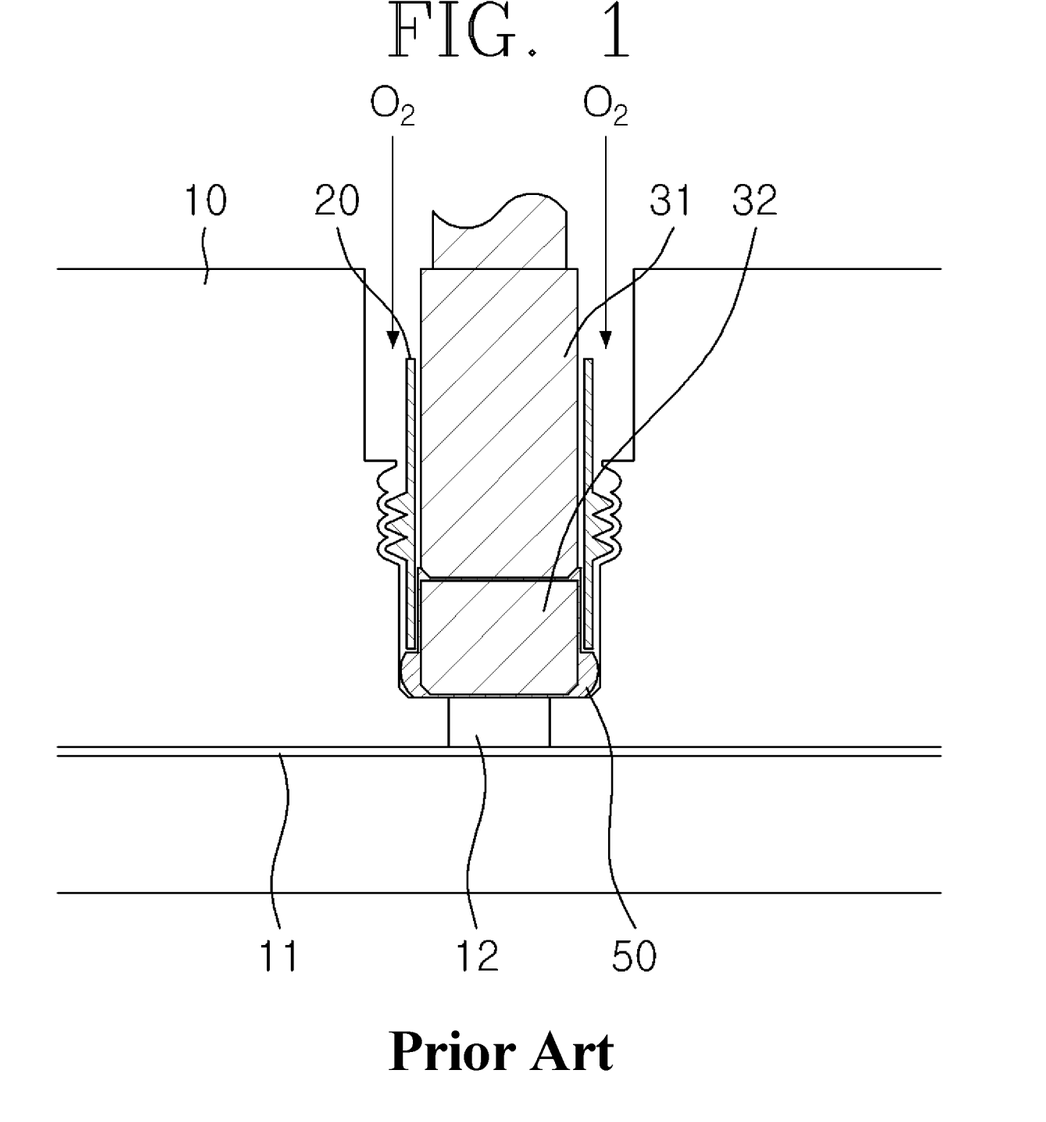
FIG. 1 illustrates an electrode portion of a conventional ceramic susceptor.

FIG. 1 illustrates an electrode portion of a conventional ceramic susceptor. Referring to FIG. 1, the conventional ceramic susceptor has an electrode portion for combining with external radio-frequency rods (RF Rods) 31 and 32 in the center of a ceramic plate 10. In the ceramic plate 10, an RF mesh 11 is embedded in a circular or half-moon shape, and a connector 12 as an electrode base material electrically connected to the RF mesh 11 is embedded. An eyelet-shaped support 20 is screwed through screw threads formed on an opening, and there are brazing joints between the top rod 31 and the bottom rod 32 and between the bottom rod 32 and the connector 12, respectively, leading to electrical connection between the rods 31 and 32 for power supply and the RF mesh 11. In such a conventional ceramic susceptor, a gap between the support 20 and the bottom rod 32 and a gap between the support 20 and the ceramic plate 10 make routes, through which oxygen can permeate in high-temperature environments, thereby oxidizing a brazing filler formed in the interface between the connector 12 as an electrode base material and the bottom rod 32. A brazing filler formed in the interface between the top rod 31 and the bottom rod 32 may also be oxidized by oxygen permeation. Such oxidation may cause a reduction in electrical conductivity and a drop in power transmission efficiency, thereby degrading the reliability of the electrode portion and decreasing the lifespan of the ceramic susceptor.

To overcome such reliability problems, a heat-resistant and oxidation-resistant material, such as a Ni or Ni alloy material, has been mainly used for conventional electrode rods. The Ni material applied to the conventional electrode rods is ferromagnetic, and thus when such a Ni material is used for a power transmission line for a high radio-frequency region, the skin depth is small due to the skin effect within the line through which electrons are to be moved, thereby making it difficult for electrons to move, resulting in an increase in impedance and the production of heat. Moreover, the operating conditions of a ceramic susceptor for semiconductor processing require high plasma characteristics at high temperatures, and thus high-power radio-frequency waves are essentially applied. Therefore, a material, such as nickel (Ni), in the electrode structure of the conventional ceramic susceptor increases the skin effect more greatly due to inherent magnetic properties (ferromagnetism) thereof, resulting in the frequent occurrence of short circuits due to oxidation as mentioned above.

To solve the above problems, Korean Patent Publication No. 10-2018-0121662 (7 Nov. 2018) discloses that a rod base material of NI or Ti was coated with Au, Ag, Al, Cu, or the like, or Korean Patent Publication No. 10-2021-0139368 (22 Nov. 2021) discloses that an alumina thin film is coated on a rod base material of Mo, Ni, or Ti to reduce the production of heat or reduce thermal conductivity. However, even such cases fail to fundamentally solve the impedance increase problem of electrode rod materials caused by an increase in frequency in the power transmission of a radio-frequency region.

SUMMARY

The present inventors confirmed that when a Ni or Ni alloy material, which has a high relative permeability (<600) due to ferromagnetism thereof, is used as a radio-frequency rod, the skin depth is extremely small within a radio-frequency rod due to the skin effect as the power and frequency increase, thereby making it difficult for electrons to move, resulting in an increase in impedance. This increase in impedance of the rod may be a factor in reducing plasma efficiency as electric energy intended for plasma discharge is converted into heat energy at the rod end and then consumed, as well as a factor in reducing yields as the heat generated at the rod forms a hot-spot zone on the upper surface of a ceramic plate supporting a substrate to thereby cause non-uniformity in thickness and quality of a thin film deposited on the substrate. Moreover, the temperature of a ceramic site in contact with a rod-fastened region is locally and rapidly increased, which is a decisive factor in the destruction of the ceramic susceptor due to thermal shock and the generation of arc due to the damage to a brazing joint, so that the impedance problem of the rod needs to be necessarily solved to increase the yield of semiconductor devices and enhance the durability of the ceramic susceptor.

Accordingly, an aspect of the present disclosure is to provide a ceramic susceptor employing a rod structure with a low impedance and favorable radio frequency transmission characteristics by selecting, as a material to be applied to a rod of the ceramic susceptor, a material that has all of thermal, electrical (magnetic), and mechanical properties required in manufacturing and treatment process environments of the ceramic susceptor, can prevent oxidation even in oxidation resistance and corrosion resistance environments to cause no short circuit, and has a low specific resistivity and a low relative permeability.

In accordance with an aspect of the present disclosure, there is provided a ceramic susceptor including a ceramic plate with a radio-frequency electrode disposed therein, wherein the ceramic plate includes a connector connected to the radio-frequency electrode, the ceramic susceptor includes a rod having one end connected to the connector to supply power to the radio-frequency electrode, and the rod employs Mo, W, or an alloy thereof as a base material, wherein a metal nitride film may be included on the surface of the base material.

The metal nitride film may include AlCrN.

The ceramic susceptor may further include a CrN underlayer between the base material and the AlCrN film.

The thickness of the CrN underlayer may be 0.1-4.0 µm.

The thickness of the metal nitride film may be 1.0-10.0 µm.

The metal nitride film may be coated by physical vapor deposition (PVD).

According to the ceramic susceptor of the present disclosure, a material, such as Mo or W, as an optimum practical material with a low impedance, is applied to a radio-frequency rod and an AlCrN or CrN/AlCrN coating film is formed for oxidation (corrosion) prevention, so that a ceramic susceptor can be provided allowing a rod structure wherein the rod structure can prevent oxidation even in oxidation-resistant and corrosion-resistant environments to cause no short circuit and have a low impedance and favorable radio-frequency transmission characteristics due to a material, such as M or W, having a low specific resistance and a low relative permeability.

BRIEF DESCRIPTION OF THE DRAWINGS

The accompanying drawings, which are included as a part of the description to help the understanding of the disclosure, provide embodiments of the disclosure and, together with the description, illustrate the technical spirit of the disclosure.

DETAILED DESCRIPTION OF THE EXEMPLARY EMBODIMENTS

Hereinafter, the present disclosure will be described in detail with reference to the accompanying drawings. In each drawing, like components are denoted by like reference numerals. Furthermore, the detailed description of known functions and/or components will be omitted. The following disclosed contents mainly describe portions required to understand operations according to embodiments and the description of elements which make the gist of the description obscure will be omitted. Furthermore, some of components of the drawings may be exaggerated, omitted, or schematically illustrated. A size of each component does not completely reflect a real size and therefore the contents disclosed herein are not limited by a relative size or interval of the components illustrated in the drawings.

In the description of embodiments of the present disclosure, when it is determined that a detailed description with respect to known technology related to the disclosure may unnecessarily obscure a gist of the present disclosure, a detailed description thereof will be omitted. The terminology used hereinafter is terms defined by considering a function in embodiments of the disclosure, and their meaning may be changed according to intentions of a user and an operator, customs, or the like. Accordingly, the terminology will be defined based on the contents throughout this specification. The terminology used in the detailed description is used for describing embodiments of the disclosure, and is not used for limiting the disclosure. Elements of the disclosure in the singular may number one or more, unless the context clearly indicates otherwise. It will be further understood that the terms "comprising" and/or "including", when used herein, specify the presence of stated features, items, steps, operations, elements, and/or components, but do not preclude the presence or addition of one or more other features, items, steps, operations, elements, components, and/or groups thereof The terms first, second, and the like may be used herein to describe various elements. These elements should not be limited by these terms, as these terms are only used to distinguish one element from another unless stated otherwise or the context clearly indicates otherwise.

Figure 2:
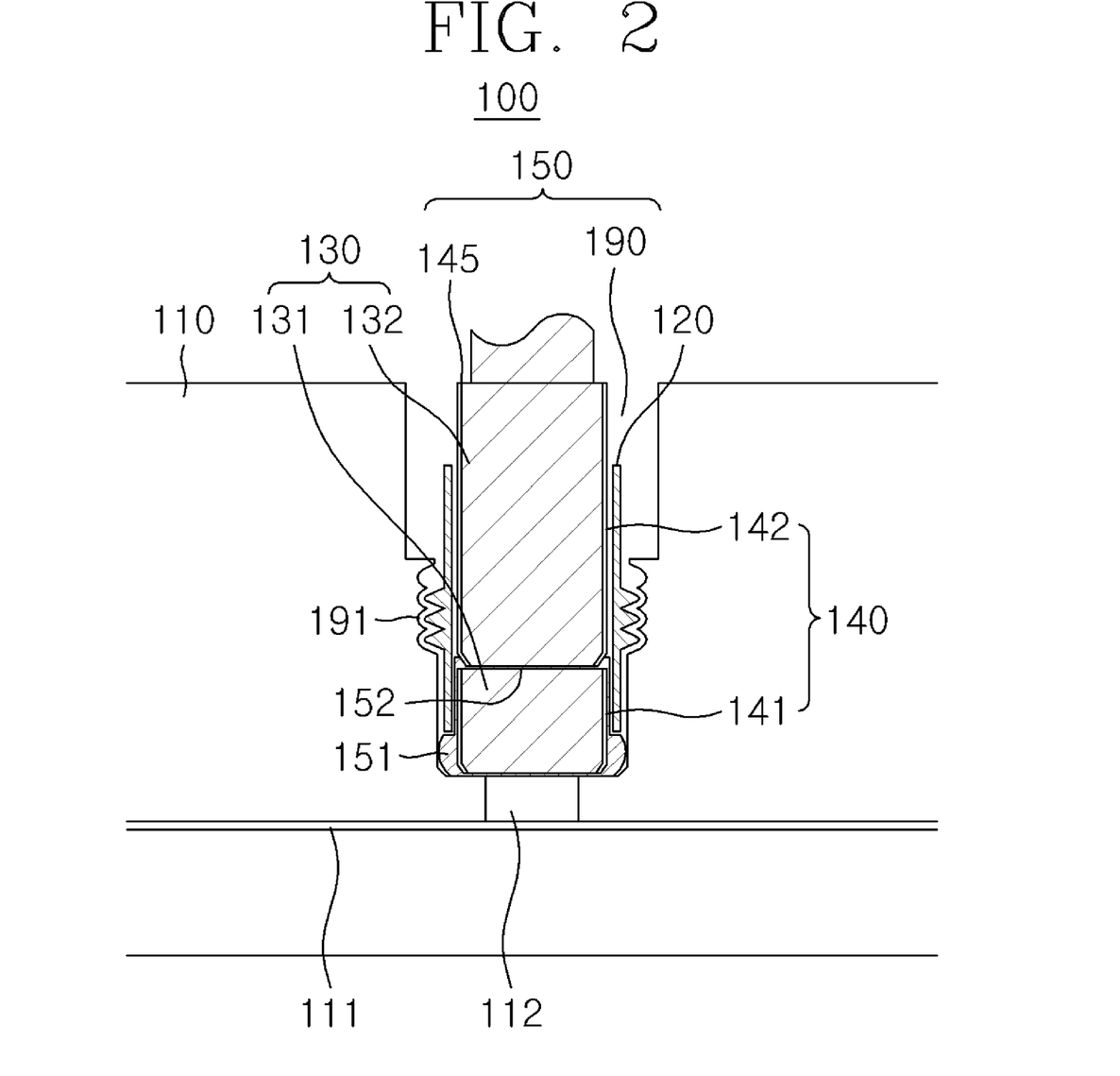
FIG. 2 shows a cross-sectional image illustrating the structure of a ceramic susceptor according to an embodiment of the present disclosure.

FIG. 2 shows a cross-sectional image illustrating the structure of a ceramic susceptor 100 according to an embodiment of the present disclosure.

Referring to FIG. 2, a ceramic susceptor 100 according to an embodiment of the present disclosure includes: a ceramic plate 110 including a radio-frequency electrode 111 and a rod portion 150; and a rod 130, that is, a first rod 131 and a second rod 132, combined with an opening 190 of the rod portion 150. In addition, the ceramic susceptor 100 may include a support eyelet 120 combined with the rod 130. The ceramic plate 110 includes the radio-frequency electrode 111 embedded in a ceramic material. The rod 130, which is a constituent element for supplying power (e.g., radio-frequency (RF) power) to the radio-frequency electrode 111, is combined with the support eyelet 120 fastened to the ceramic plate 110 through screw threads 191 of the ceramic plate 110.

The rod portion 150 of the ceramic plate 110 includes a connector 112 in the opening 190 for the connection with the rod 130, and also includes screw threads 191 formed on a part of the inner circumferential surface of the opening 190. The support eyelet 120 combined with the rod 130 may have corresponding screw threads (e.g., male screw threads) on the outer circumferential surface thereof for fastening through the screw threads 191 (e.g., female screw threads).

As described above, although not shown in the drawing, the ceramic plate 110 of the present disclosure may further include, in addition to the high-frequency electrode 111, a heating element (not shown) for a heater function and a corresponding rod, in the ceramic material. Although the structures of the raid-frequency electrode 111 and the rod portion 150 are described, it is noted that such structures may also be applied as they are to a heating element (not shown) and a rod portion for connection of the corresponding rod.

That is, the ceramic plate 110 may be configured such that the radio-frequency electrode 111 and (or) the heating element (not shown) are disposed (embedded) at a predetermined interval in the ceramic material. The ceramic plate 110 may be configured to be capable of heating using the heating element (not shown) and (or) plasma-enhanced chemical vapor deposition using the radio-frequency electrode 111 while stably supporting a substrate to be processed. The ceramic plate 110 may be formed as a plate-like structure with a predetermined shape. For example, the ceramic plate 110 may be formed as a circular plate-like structure, but is not necessarily limited thereto. Especially, the ceramic material may be at least one material of $Al_2O_3$, $Y_2O_3$, $Al_2O_3/Y_2O_3$, $ZrO_2$, autoclaved lightweight concrete (Aic), TiN, AlN, TiC, MgO, CaO, $CeO_2$, $TiO_2$, $B_xC_y$, BN, $SiO_2$, SiC, YAG, mullite, and $AlF_3$, and may be preferably aluminum nitride (AlN). Additionally, the ceramic plate 110, when molded, may contain a ceramic powder and, optionally, about 0.1 to 10%, preferably about 1 to 5% of an yttrium oxide or magnesium oxide.

The connector 112 is embedded in the ceramic plate 110 so as to be electrically connected to the radio-frequency electrode 111 and partially exposed to the bottom surface of the opening 190. An end surface of the rod 130 and the connector 112 are electrically connected by brazing joining.

The radio-frequency electrode 111, the connector 112, the rod 130, the support eyelet 120, the heating element (not shown), and the like may be formed of a conductive material, for example, tungsten (W), molybdenum (Mo), silver (Ag), copper (Cu), nickel (Ni), gold (Au), platinum (Pt), niobium (Nb), titanium (Ti), or an alloy thereof.

Preferably, the rod 130 in the present disclosure has a low resistance, that is, a low impedance, and is paramagnetic. For example, as shown in Table 1, a base material for the rod 130 may be composed of not a ferromagnetic material, such as nickel (Ni), but a paramagnetic material, such as Mo, W, or an alloy containing at least one of these. An oxidation-resistant film is provided on the surface of the rod 130. In the present disclosure, preferable examples of the oxidation-resistant film may include a metal nitride film containing Cr. For example, the metal nitride film may include AlCrN, and more preferably, further include a CrN underlayer.

TABLE 1

| Material | Electrical Resistivity (nΩ · m) | Magnetism Property |
| --- | --- | --- |
| Ni | 69.3 | Ferromagnetic |
| Mo | 53.4 | Paramagnetic |
| W | 52.8 | Paramagnetic |

Therefore, the ceramic susceptor 100 can be provided that has all the thermal, electrical (magnetic), and mechanical properties required in the manufacturing and treatment process environments of the ceramic susceptor 100 and is also advantageous in processability and material cost.

In FIG. 2, the rod 130 may be combined with the inside of the support eyelet 120 and may include a first rod 131 and a second rod 132 connected to each other through brazing joining. The rod 130 may be formed as a single rod in which the first rod 131 and the second rod 132 are integrated, but as shown in the drawing, the rod 130 may have a structure in which the first rod 131 and the second rod 132 are joined together. The first rod 131 has one end surface joined to the connector 112 via a first conductive filler 151 by brazing, and the second rod 132 is joined to the other end of the first rod 131 via s second filler 152 by brazing. For example, an Au—Ni metal filler or a metal filer containing Ti may be used as the conductive filers 151 and 152. The connector 112 may be molybdenum or a molybdenum alloy. Since the first rod 131 is close to the radio-frequency electrode 111 to cause a heat loss and thermal stress, the first rod 131 preferably has a smaller coefficient of thermal expression than the second rod 132 in order to prevent a heat loss and reduce the occurrence of cracks due to thermal stress. Especially, in the present disclosure, the first rod 131 and the second rod 132 may be formed of Mo, W, or an alloy containing at least one of these, and a metal nitride film (e.g., AlCrN layer) 140, and for the prevention of oxidation (corrosion), a metal nitride film (e.g., AlCrN layer) 140 may be formed on the surface of the rod 130, that is, a metal nitride film (e.g., AlCrN layer) 141 on the surface of the first rod 131 and a metal nitride film (e.g., AlCrN layer) 142 on the surface of the first rod 132 may be included.

For the brazing joining as described above, the first conductive filer 151 is first injected in advance on the bottom surface of the opening 190, that is, around the exposed portion of the connector 112, and the first rod 131 is pushed inside the support eyelet 120 to bring one end surface of the first rod 131 into close contact with the connector 112, followed by heating at a high temperature and cooling. Then, the second conductive filer 152 is sufficiently injected on the other end surface of the first rod 131, and one end surface of the second rod 132 is brought into close contact on the injected second conductive filer 152, followed by heating at a high temperature and cooling.

In the use of the ceramic susceptor 100 according to an embodiment of the present disclosure, power is supplied to the radio-frequency electrode 111 through the connector 112 joined to the rod 130, and thus the heat (or radio-frequency waves) generated from the heating element (not shown) is used to heat a substrate to be processed (e.g., a semiconductor wafer, a glass substrate, a flexible substrate, etc.) in the semiconductor process or the like, thereby enabling thermal treatment (or plasma-enhanced chemical vapor deposition) at a predetermined heating temperature.

Especially, the rod 130 may be formed of an alloy (e.g., MoW, MoNi, WNi, etc.) containing Mo, W, or an alloy containing at least one of these at a greater weight ratio (wt %) than other metal materials, and for the prevention of oxidation (corrosion), a metal nitride film (e.g., AlCrN layer) 140 is included on the surface of the rod 130, thereby effectively preventing the oxidation of the rod 130 and eliminating the factor of impedance increase caused by the use of the rod. Such a reduction in change, such as an impedance change of the rod 130, suppresses the loss of energy converted to heat energy at the rod 130, thereby allowing electrical energy to be efficiently consumed in the plasma discharge. In addition, a hot-spot zone is not formed on the upper surface of the ceramic plate 110 supporting a substrate since the heat generated at the rod 130 is reduced, thereby improving the uniformity of thickness and quality of the thin films deposited on the substrate and increasing yields. Furthermore, the temperature increase at the ceramic site in contact with a region, to which the rod 130 is fastened, is suppressed to thereby reduce the destruction of the ceramic susceptor 100 due to thermal shock and the generation of arc at brazing joints. Therefore, the reduction in impedance change of the rod 130 of the present disclosure can provide a ceramic susceptor 100 with enhanced durability and contribute to increasing the yield of semiconductor devices.

Figure 3:
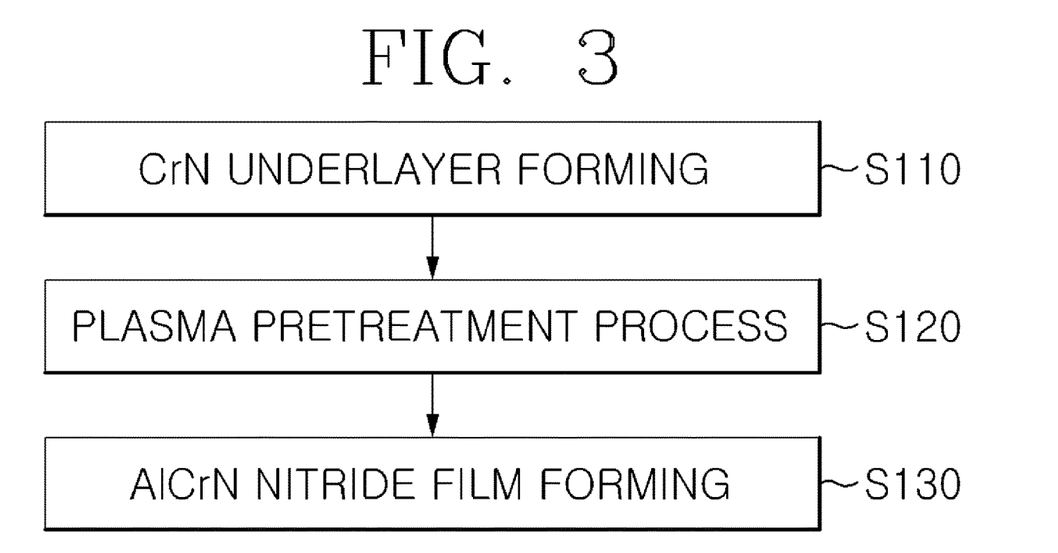
FIG. 3 shows a flowchart illustrating a process for forming a film of a rod of the ceramic susceptor according to an embodiment of the present disclosure.

FIG. 3 shows a flowchart illustrating a process for forming a film of the rod of the ceramic susceptor according to an embodiment of the present disclosure.

Referring to FIG. 3, in order to form a metal nitride film 140 (e.g., AlCrN layer) on the surface of a base material for a rod 130 of Mo, W, or an alloy containing at least one of these, physical vapor deposition (PVD), such as arc ion plating, may be applied. As shown in the drawing, the film on the rod may be formed by including a CrN underlayer (145) forming process (S110), a plasma pretreatment process (S120), and an AlCrN metal nitride film deposition process (S130).

In step S110, the CrN underlayer (145) forming process is for reducing the internal stress of the metal nitride film (e.g., AlCrN layer) 140 and ensuring favorable adhesion thereof. A CrN layer may be deposited with a thickness of 0.1 to 4.0 μm as the CrN underlayer 145 on the surface of the rod 130. In the present disclosure, the CrN underlayer 145 may be formed by arc ion plating. For example, a CrN layer may be deposited as the CrN base layer 145 on the surface of the rod 130 by arc ion plating equipment. Specifically, a Cr target is inserted in advance into the arc ion plating equipment, and the CrN layer may be formed on the surface of the rod 130 at a predetermined vacuum level by PVD while nitrogen is injected into a reactor. If the rod 130 is composed of the first rod 131 and the second rod 132, the CrN underlayer 145 may be formed on the surface of each rod.

In the plasma pretreatment process (S120), the rod 130 with the CrN underlayer 145 is inserted into the arc ion plating equipment, and then the surface of the rod 130 is cleaned through plasma pretreatment at a vacuum level of $1 \times 10^{-5}$ Torr or less, so that a subsequent metal nitride film (e.g., AlCrN layer) 140 is optimally coated.

In the AlCrN metal nitride film deposition process (S130), an AlCr alloy target is inserted in advance into the arc ion plating equipment, and after the plasma pretreatment process (S120) is completed, a metal nitride film (e.g., AlCrN layer) 140 is formed with a thickness of 1.0 to 10.0 μm at a vacuum level of about $1 \times 10^{-2}$ Torr by PVD while nitrogen is injected into the reactor. The AlCr alloy target may be an AlCr alloy target in which aluminum (Al) and chrome (Cr) are alloyed at a predetermined ratio (e.g., 7:3 wt %).

Figure 4:
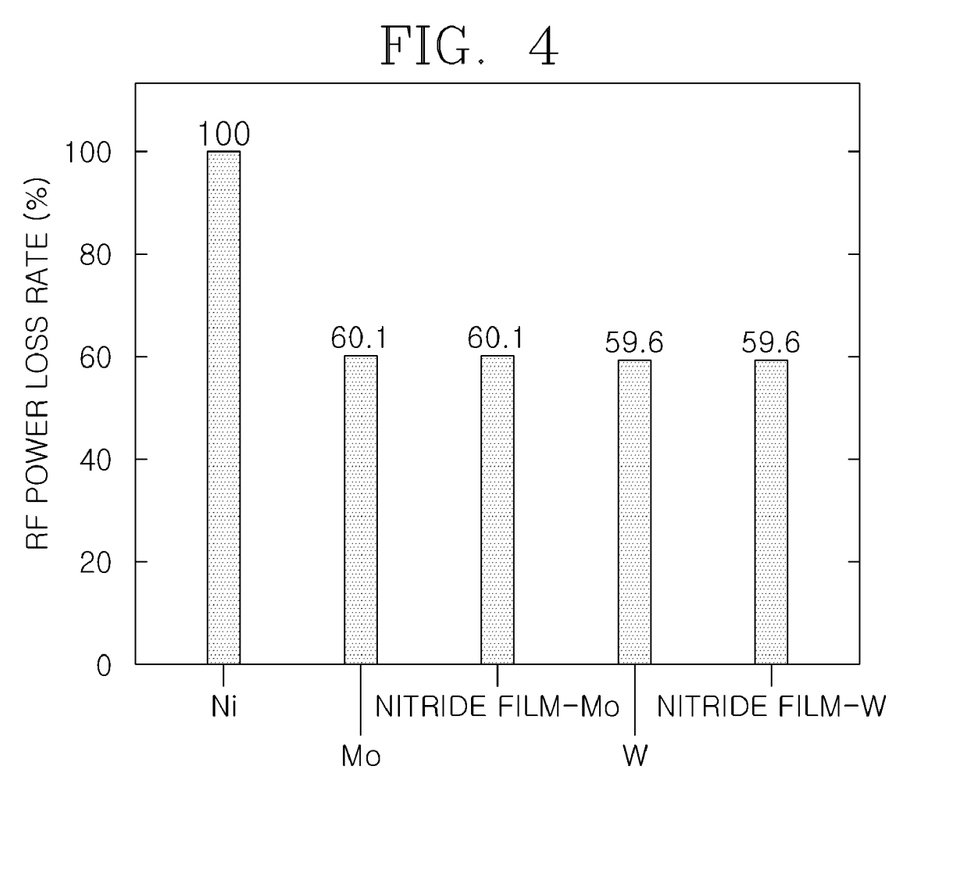
FIG. 4 illustrates the comparison of RF power loss rates when as a material for the rod of the ceramic susceptor, Ni is applied according to the conventional art and Mo, nitride film-Mo, W, and nitride film-W are applied according to the present disclosure.

FIG. 4 illustrates the comparison of RF power loss rates when as a material for the rod of the ceramic susceptor, Ni is applied according to the conventional art and Mo, nitride film-Mo, W, and nitride film-W are applied according to the present disclosure.

As shown in FIG. 4, in the radio frequency (RF) power loss rates calculated on the basis of impedance experimental values, the loss rates for Mo, nitride film-Mo where an AlCrN layer was formed on the surface thereof, W, or nitride film-W where an AlCrN layer was formed on the surface thereof showed reductions of about 40% compared with the loss rate for Ni. As can be seen through the above results, Mo, W, nitride film-Mo, and nitride film-W are excellent candidates as a Ni substitute material of the rod.

Figure 5A:
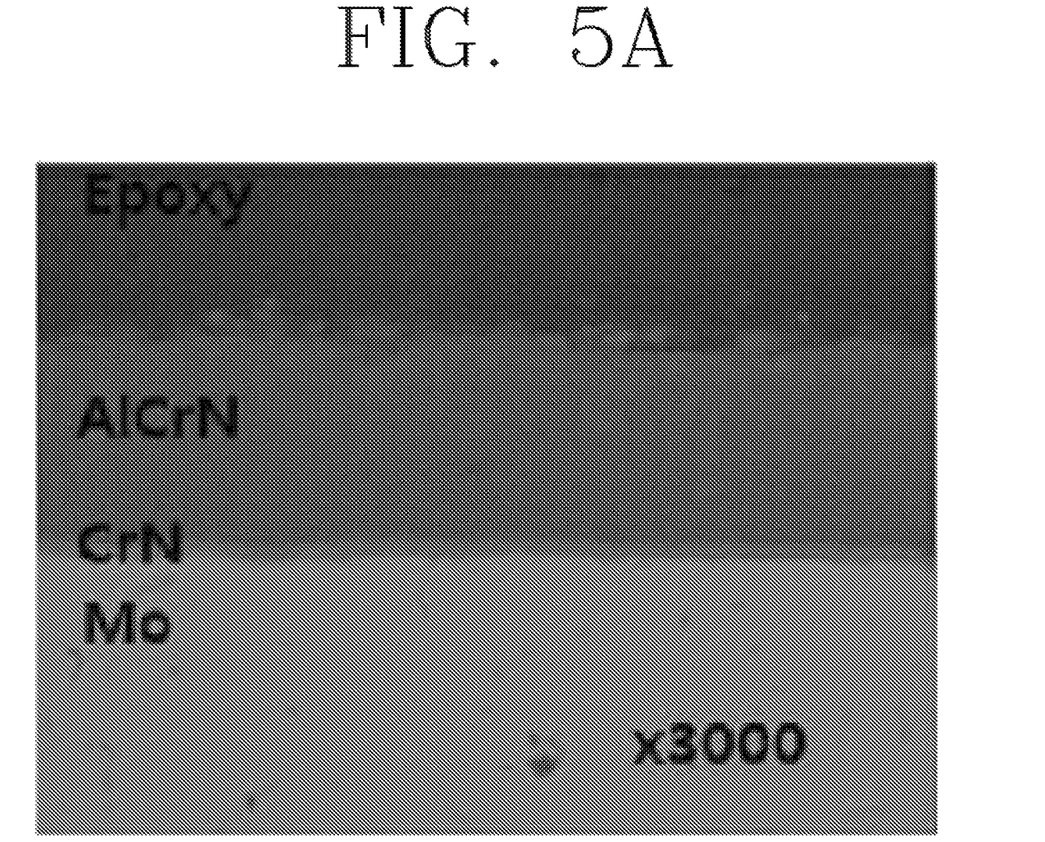
FIG. 5A and FIG. 5B shows cross-sectional images of a rod having a CrN underlayer and an AlCrN layer on the surface thereof before and after oxidation.
Figure 5B:
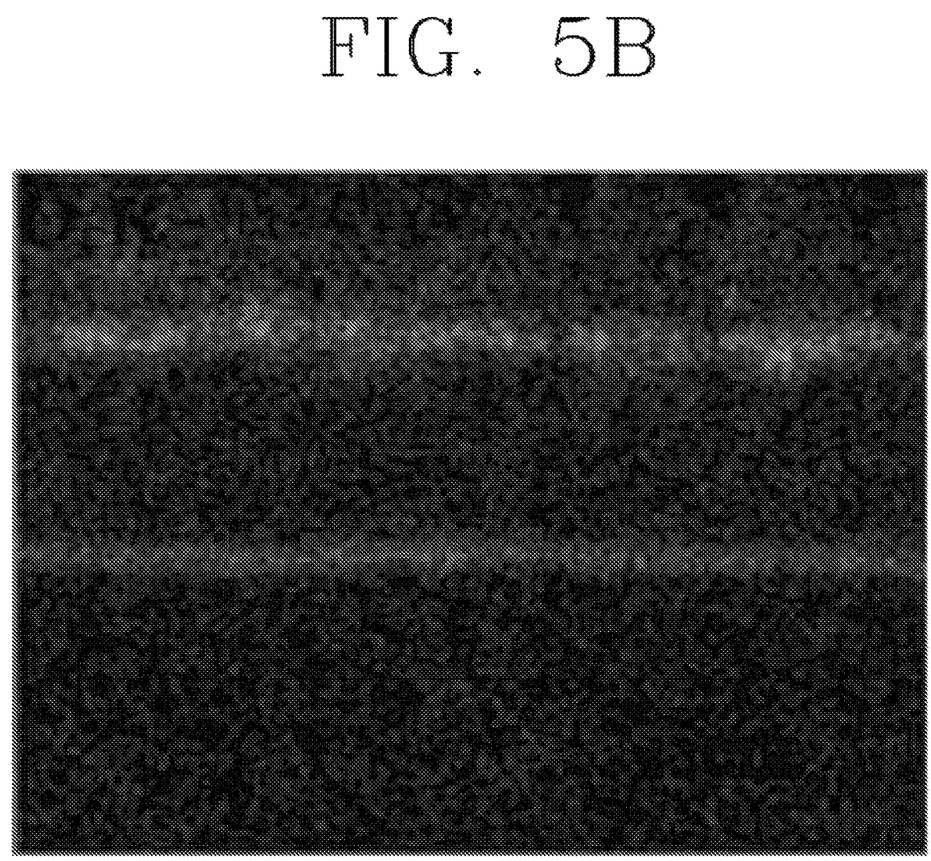

FIG. 5A shows cross-sectional images of a rod having a CrN underlayer 145 and an AlCrN layer on the surface thereof before oxidation. FIG. 5B shows cross-sectional images of a rod having a CrN underlayer 145 and an AlCrN layer on the surface thereof after oxidation.

Referring to FIG. 5A and FIG. 5B, as can be seen from the energy dispersive X-ray spectroscopy (EDS) images of the rod 130 of the present disclosure, an oxidation layer was hardly formed on the AlCrN layer 140 and no cracks were generated on in coating films, such as the CrN underlayer 145 and the AlCrN layer 140 before (a) and after (b) oxidation at a high temperature, due to the CrN underlayer 145 and the AlCrN layer 140 coated on the surface of the Mo base material. In the present disclosure, the metal nitride film (e.g., AlCrN layer) 140 for oxidation prevention is formed on the surface of the rod 130 in order to suppress the oxidation (corrosion) as described above. A coating material coated on the base material of the rod 130, which is formed of Mo, W, or an alloy containing at least one of these, needs to be also selected considering price and coating workability as well as thermal, electrical (magnetic), and mechanical requirements, like in the selection of the rod material. For example, it was verified that the CrN underlayer 145 and the AlCrN layer 140 as the metal nitride film 140 coated by physical vapor deposition (PVD) were most effective in oxidation prevention. However, a TiAlN coating material shows cracks when used at high temperatures, thereby making it difficult to protect a base material, such as Mo or W.

Figure 6A:
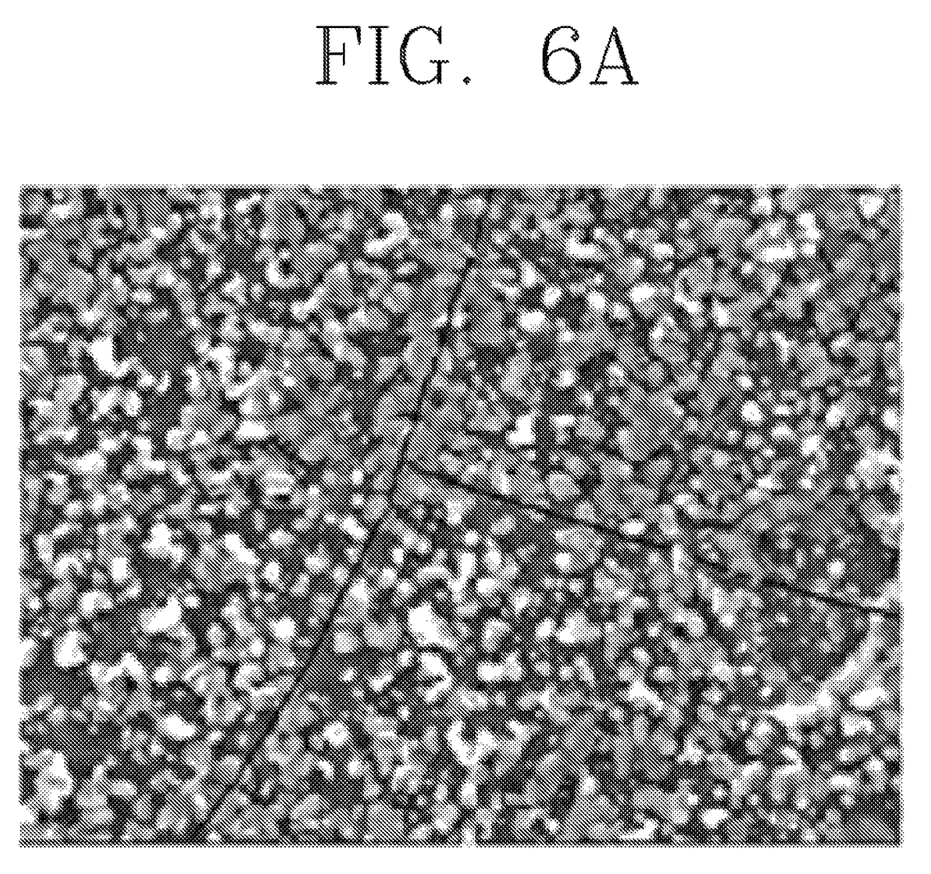
FIG. 6A and FIG. 6B shows surface SEM images of the rods of the present disclosure without a CrN underlayer and with a CrN underlayer.
Figure 6B:
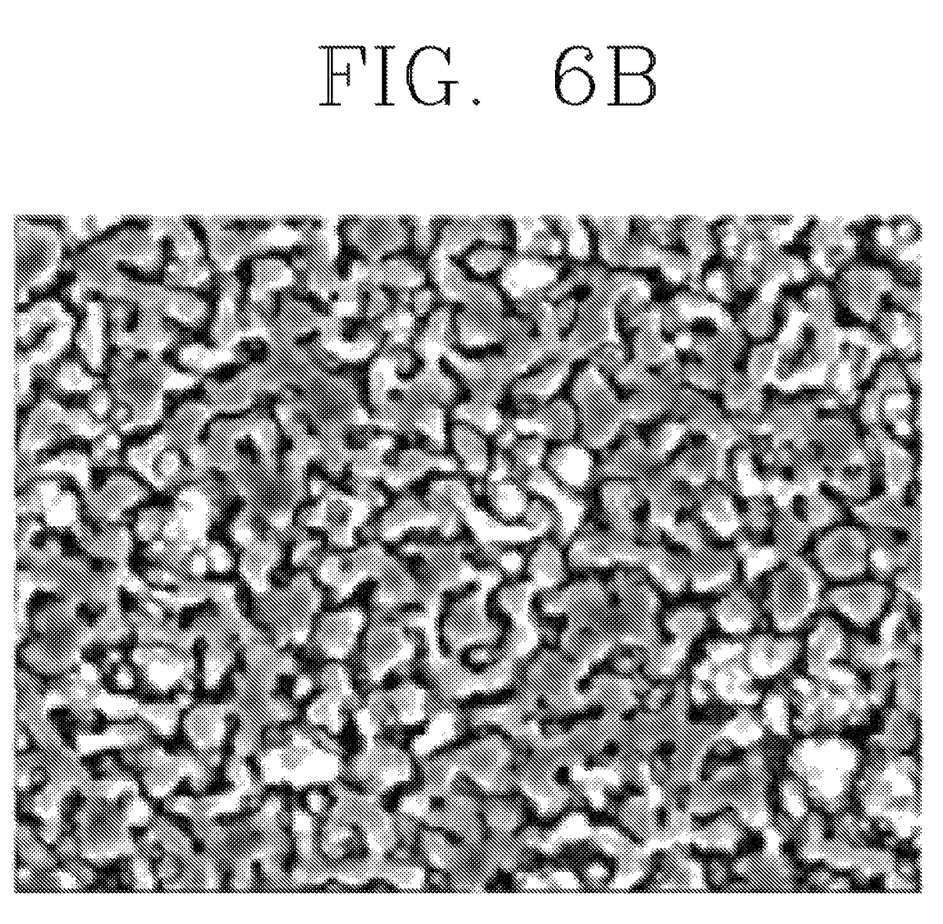

FIG. 6A shows surface SEM images of the rods of the present disclosure without the CrN underlayer 145. FIG. 6B shows surface SEM images of the rods of the present disclosure with the CrN underlayer 145.

Referring to FIG. 6A and FIG. 6B, as can be seen in the scanning electron microscope (SEM) images of the rods 130 of the present disclosure, the grain diameters in the surface metal nitride film (e.g., AlCrN layer) 140 were larger and more uniform when the CrN underlayer 145 was disposed on the rod 130 than otherwise, thereby increasing an antioxidation effect and promoting the prevention of crack generation.

As described above, according to the ceramic susceptor 100 of the present disclosure, a material, such as Mo or W, as an optimum practical material with a low impedance, is applied to the radio-frequency rod 130, and the AlCrN coating film 140 or the CrN/AlCrN coating films (145/140) is formed for oxidation (corrosion) prevention, so that a ceramic susceptor can be provided allowing a rod structure wherein the rod structure can prevent oxidation even in oxidation-resistant and corrosion-resistant environments to cause no short circuit and have a low impedance and favorable radio-frequency transmission characteristics due to a material, such as M or W, having a low specific resistance and a relative permeability.

The specified matters and limited embodiments and drawings such as specific elements in the present disclosure have been disclosed for broader understanding of the present disclosure, but the present disclosure is not limited to the embodiments, and various modifications and changes are possible by those skilled in the art without departing from an essential characteristic of the present disclosure. Therefore, it should be understood that the spirit of the present disclosure is not limited to the above-described embodiments, and that the appended claims as well as all technical ideas that are equivalent to the scope of claims or that include equivalent modifications may fall within the scope of the rights of the present disclosure embodiments.

What is claimed is:

1. A ceramic susceptor comprising a ceramic plate with a radio-frequency electrode disposed therein,
   wherein the ceramic plate comprises a connector connected to the radio-frequency electrode,
   the ceramic susceptor comprises a rod having one end connected to the connector to supply power to the radio-frequency electrode, and the rod employs Mo, W, or an alloy thereof as a base material, wherein an opening is disposed in the ceramic plate, and one end of the rod is brazed and joined to the connector by a conductive filler inside the opening, wherein an ALCrN film is coated on a vertical outer surface of the rod, and wherein the base material of the rod reduces a power loss in response to a skin effect that occurs when a high-frequency signal is applied to the rod, and the AlCrN film prevents oxidation of the rod and suppresses an impedance increase caused by a use of the rod.

2. The ceramic susceptor of claim 1, further comprising a CrN underlayer between the base material and the AlCrN film.

3. The ceramic susceptor of claim 2, wherein the thickness of the CrN underlayer is 0.1-4.0 μm.

4. The ceramic susceptor of claim 1, wherein the thickness of the AlCrN film is 1.0-10.0 μm.

5. The ceramic susceptor of claim 1, wherein the AlCrN film is coated by physical vapor deposition (PVD).

* * * * *